(12) United States Patent
Bonaccio et al.

(10) Patent No.: US 7,219,113 B2
(45) Date of Patent: May 15, 2007

(54) PSEUDO-RANDOM BINARY SEQUENCE CHECKER WITH AUTOMATIC SYNCHRONIZATION

(75) Inventors: Anthony R. Bonaccio, Shelburne, VT (US); Allen P. Haar, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 713 days.

(21) Appl. No.: 10/605,381

(22) Filed: Sep. 26, 2003

(65) Prior Publication Data

US 2005/0071399 A1  Mar. 31, 2005

(51) Int. Cl.
*G06F 7/58* (2006.01)

(52) U.S. Cl. .................................... 708/250
(58) Field of Classification Search ............... 708/250
See application file for complete search history.

(56) References Cited

U.S. PATENT DOCUMENTS

| | | | | |
|---|---|---|---|---|
| 4,998,263 A | * | 3/1991 | Kendall et al. ............. | 375/367 |
| 5,383,143 A | * | 1/1995 | Crouch et al. .............. | 708/254 |
| 6,002,714 A | * | 12/1999 | Huscroft ..................... | 375/224 |
| 6,094,737 A | * | 7/2000 | Fukasawa .................... | 714/738 |
| 6,393,594 B1 | * | 5/2002 | Anderson et al. ........... | 714/738 |
| 6,490,317 B1 | * | 12/2002 | Huscroft ..................... | 375/224 |

* cited by examiner

*Primary Examiner*—D. H. Malzahn
(74) *Attorney, Agent, or Firm*—Riyon Harding; Dillon & Yudell LLP

(57) ABSTRACT

A pseudo-random binary sequence checker having automatic synchronization is disclosed. The pseudo-random binary sequence checker includes a receiver, a synchronizer, and a comparator. The receiver is capable of receiving a pseudo-random binary sequence, which is generated by a pseudo-random binary sequence generator, in a parallel fashion n bits at a time. The synchronizer automatically synchronizes the state of the receiver with an n-bit sample within the pseudo-random binary sequence and calculate all subsequent n-bit sample within the pseudo-random binary sequence. The comparator compares the subsequent calculated n-bit sample within the pseudo-random binary sequence to the next subsequent next received n-bit sample within the pseudo-random binary sequence to indicate an error condition has occurred if each calculated n-bit sample within the pseudo-random binary sequence does not equal to the corresponding received n-bit sample within the pseudo-random binary sequence.

12 Claims, 9 Drawing Sheets

PRBS Out

US 7,219,113 B2

PSEUDO-RANDOM BINARY SEQUENCE CHECKER WITH AUTOMATIC SYNCHRONIZATION

BACKGROUND OF INVENTION

1. Technical Field

The present invention relates to equipment testing in general, and in particular, to an apparatus for testing data communication channels. Still more particularly, the present invention relates to a pseudo-random binary sequence checker for testing data communication channels.

2. Description of the Related Art

In order to test the proper functioning of a data communication channel, such as a high-speed serial optical interface or a hard disk device interface, a known binary data sequence is typically injected into the input of the data communication channel, and then errors are checked at the output of the data communication channel. Ideally, the binary data sequence should be completely random in nature; that is, the probability of an occurrence of a logical "1" symbol is 50% regardless of the previously transmitted symbols. Such complete randomness, however, is impractical because a binary sequence checker located at the output of the data communication channel will, by definition, have no knowledge of the transmitted data sequence, and it would be impossible to verify the correctness of the received data sequence with reference to the transmitted data sequence.

In order to solve the above-mentioned problem, hardware structures known as pseudo-random binary sequence generators are used to generate testing sequences. The testing sequences generated by pseudo-random binary sequence generators are "pseudo-random" in the sense that the frequency of occurrence of "1" and "0" symbols is close to 50%. Hence, such testing sequences appear random from that standpoint even though they are actually deterministic. In other words, once a certain number of consecutive symbols in a testing sequence are known, it is possible to calculate all subsequent symbols in the testing sequence, given that the algorithm used to generate the testing sequence is also known. Such deterministic characteristic allows a pseudo-random binary sequence checker located at the receiving end of a data communications channel to verify the correctness of the transmitted sequence.

The present disclosure describes an improved pseudo-random binary sequence checker for testing data communication channels.

SUMMARY OF INVENTION

In accordance with a preferred embodiment of the present invention, a pseudo-random binary sequence checker includes a receiver, a synchronizer, and a comparator. The receiver is capable of receiving a pseudo-random binary sequence, which is generated by a pseudo-random binary sequence generator, in a parallel fashion n bits at a time. The synchronizer automatically synchronizes the state of the receiver with an n-bit sample within the pseudo-random binary sequence and calculate all subsequent n-bit sample within the pseudo-random binary sequence. The comparator compares the subsequent calculated n-bit sample within the pseudo-random binary sequence to the subsequent next received n-bit sample within the pseudo-random binary sequence to indicate an error condition has occurred if each calculated n-bit sample within the pseudo-random binary sequence does not equal to the corresponding received n-bit sample within the pseudo-random binary sequence.

All objects, features, and advantages of the present invention will become apparent in the following detailed written description.

BRIEF DESCRIPTION OF DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION

A pseudo-random binary sequence (PRBS) can be generated by a hardware structure known as a linear feedback shift register (LFSR). An LFSR can be implemented by a string of latches, with the input of a latch n driven by the output of a latch n-1. The input of an initial latch in the string is driven by a linear combination, typically an XOR, of the contents of other latches within the latch string. The choice of latches contributing to the linear feedback to the input latch is called the PRBS polynomial. The linear feedback bit (or the input to the first latch in the latch string) is also the point at which the PRBS output is typically taken.

Figure 1:
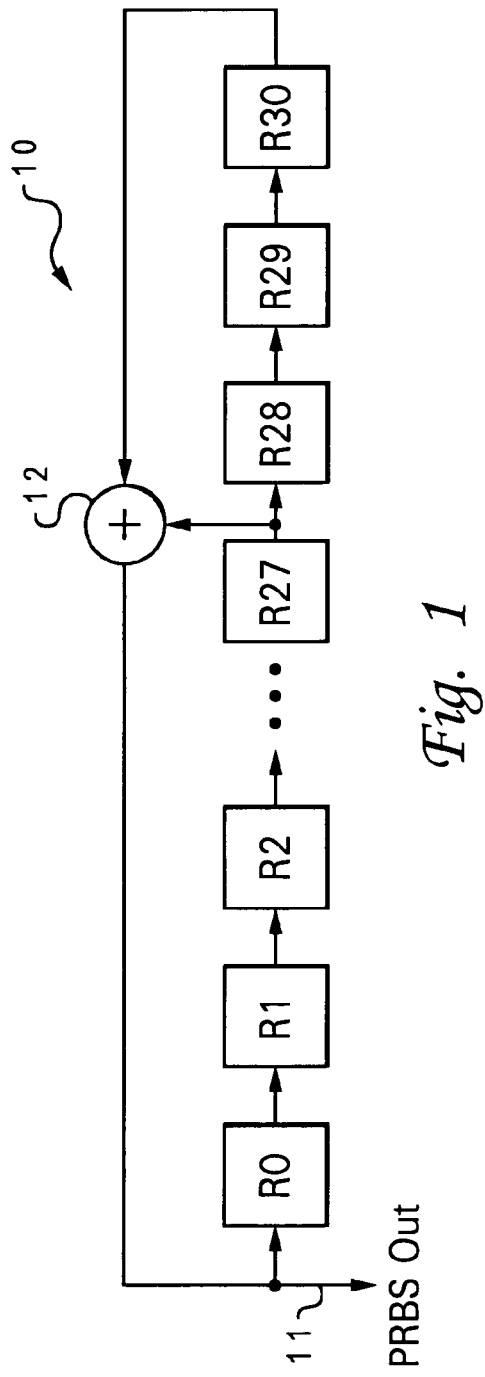
FIG. 1 is a block diagram of a pseudo-random binary sequence generator.

Referring now to the drawings and in particular to FIG. 1, there is depicted a block diagram of an LFSR-based PRBS generator. As shown, an LFSR-based PRBS generator 10 includes latches R0–R30 with a PRBS polynomial of $1+x^{28}+x^{31}$, where a + sign represents a mod 2 addition or an XOR operation. Each of latches R0–R30 receives a common clock of period T ns and frequency f=1/T GHz. Thus, bits shift from latch to latch every T ns and a new bit is generated at an output 11 every T ns.

The latch string in LFSR-based PRBS generator 10 can be initialized to any number combination except all zeros. For this reason, the LFSR approach is often characterized as a $2^{n}-1$ PRBS, where n is the number of latches within the latch string. The contents of the latches can be any of $2^n$ states, but the all-zero state is unique because if PRBS generator 10 enters the all-zero state, PRBS generator 10 will remain in such state indefinitely since there will never be a "1" in any of the latches to force a new "1" to be generated at the output of an XOR gate 12. Hence, the all-zero state is disallowed and there are $2^{n}-1$ states remaining. Incidentally, there are also $2^{n}-1$ bits in the sequence before the sequence repeats itself.

Figure 2:
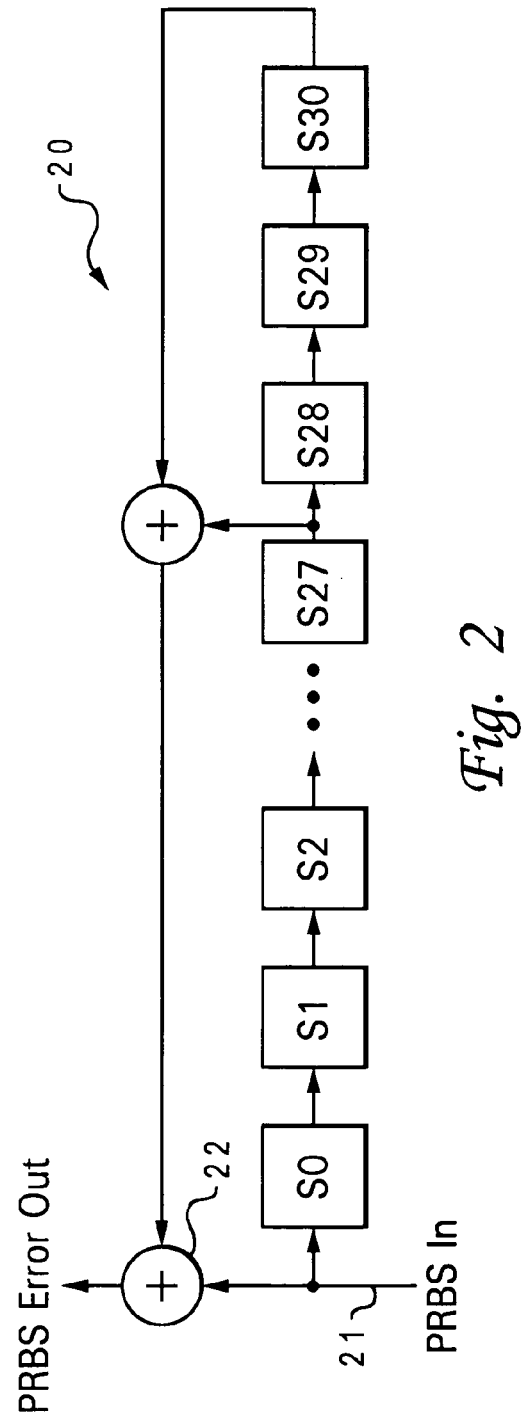
FIG. 2 is a block diagram of a pseudo-random binary sequence checker.

Given that PRBS generator 10 is properly initialized to generate a PRBS, it is possible to use a nearly identical structure to verify that the correctness of the bits received. With reference now to FIG. 2, there is depicted an LFSR-based PRBS checker. As shown, an LFSR-based PRBS checker 20 includes latches S0–S30 with a PRBS polynomial of $1+x^{28}+x^{31}$, where a + sign represents a mod 2 addition or an XOR operation. Instead of feeding a LFSR polynomial back to the input, such as LFSR-based PRBS generator 10 from FIG. 1, the LFSR polynomial is compared to a received sequence 21 during each clock interval at an XOR gate 22. When a bit from the LFSR polynomial disagrees with a corresponding bit within received sequence 21, an error is flagged. A single bit error event will be flagged at least two more times because the bit in error propagates through PRBS checker 20.

PRBSs can be used for, inter alia, verifying high-speed optical data channels. In those cases, the operating frequency f of a PRBS generator can be relatively high. For example, the bit rate according to the SDH/SONET OC-192 standard is 10 Gbit/s, and the bit rate according to the SDH/SONET OC-768 standard is 40 Gbit/s. In other words, a new bit must be generated by a PRBS generator and/or checked by a PRBS checker every 100 ps for the OC-192 standard and every 25 ps for the OC-768 standard. At those high frequencies, every latch within the PRBS checker may consume a great deal of power (in the range of hundreds of milliwatts).

In accordance with a preferred embodiment of the present invention, a "parallel" version of PRBS checker having its clock frequency divided by some factor is used to alleviate the above-mentioned power consumption concern.

Figure 3:
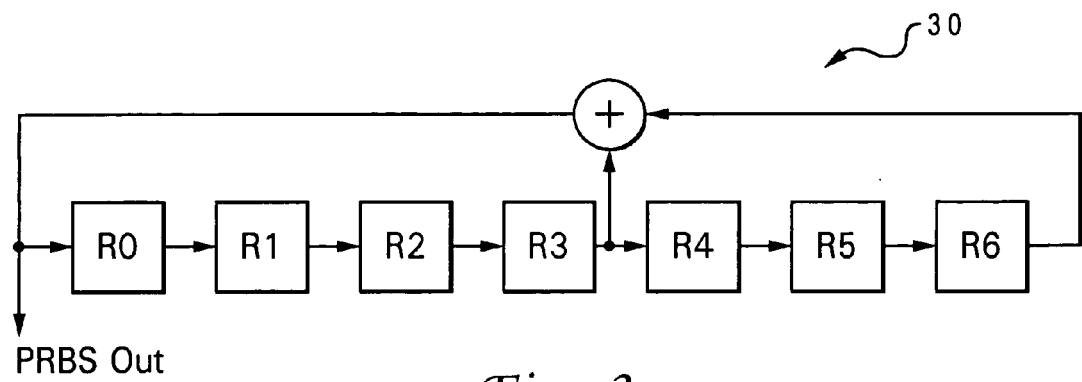
FIG. 3 is a block diagram of a 7-bit pseudo-random binary sequence generator.

Referring now to FIG. 3, there is depicted a block diagram of a 7-bit PRBS generator for illustrating the principle of the present invention. This differs from the PRBS generator 10 from FIG. 1 only in that it has fewer latches and as a result, a complete analysis can be shown here more easily. As shown in FIG. 3, a 7-bit PRBS generator 30 includes latches R0–R6 with a PRBS polynomial of $1+x^{4}+x^{7}$. After the latches within PRBS generator 30 have been initialized into a non-all-zero state, the contents of the latches for the first four clock cycles are given by Table I, in which a + sign once again represents a mod 2 addition XOR operation.

TABLE I

| cycle | R0 | R1 | R2 | R3 | R4 | R5 | R6 |
|---|---|---|---|---|---|---|---|
| 0 | $R0_0$ | $R1_0$ | $R2_0$ | $R3_0$ | $R4_0$ | $R5_0$ | $R6_0$ |
| 1 | $R6_0 + R3_0$ | $R0_0$ | $R1_0$ | $R2_0$ | $R3_0$ | $R4_0$ | $R5_0$ |
| 2 | $R5_0 + R2_0$ | $R6_0 + R3_0$ | $R0_0$ | $R1_0$ | $R2_0$ | $R3_0$ | $R4_0$ |
| 3 | $R4_0 + R1_0$ | $R5_0 + R2_0$ | $R6_0 + R3_0$ | $R0_0$ | $R1_0$ | $R2_0$ | $R3_0$ |
| 4 | $R3_0 + R0_0$ | $R4_0 + R1_0$ | $R5_0 + R2_0$ | $R6_0 + R0_0$ + $R3_0$ | $R0_0$ | $R1_0$ | $R2_0$ |

At cycle 4, the output bit computed in cycle 1 is in R3 and the next three compute output bits are in R2, R1, and R0, respectively. It can be observed that all contents of all latches can be computed directly from the initialization state. This means that PRBS checker 30 can be configured to jump directly from clock interval 0 to clock interval 4 and the output read in parallel from R0–R3. In other words, PRBS generator 30 can be reconfigured and clocked at ¼ of the original rate, presenting the output in parallel, 4 bits at a time, instead of one bit at a time serially. The reconfiguration requires the same number of latches augmented by three additional XOR gates 41–43, as shown in FIG. 4.

Figure 4:
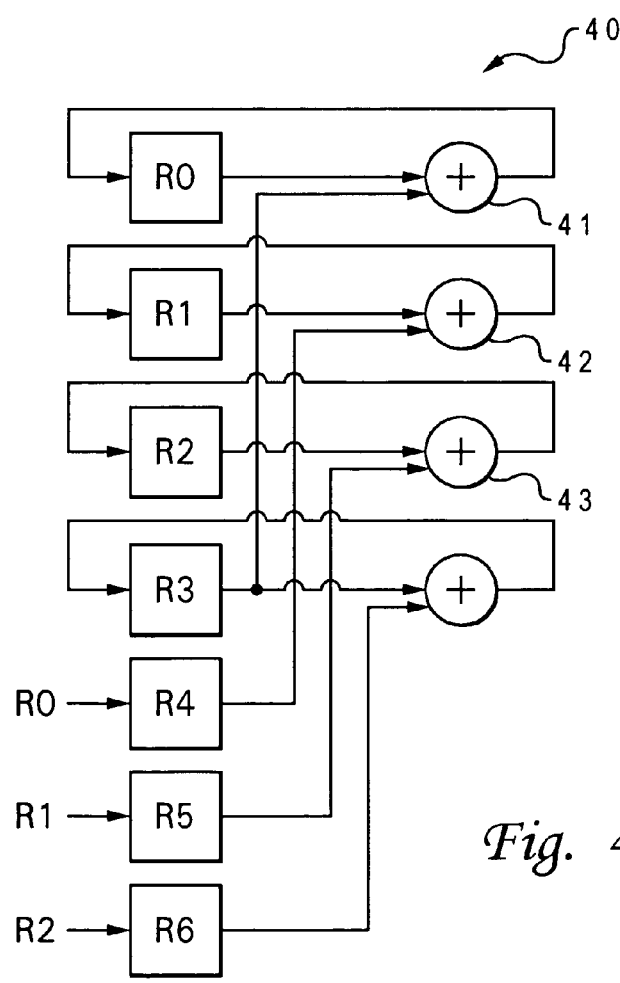
FIG. 4 is a block diagram of a 7-bit parallel pseudo-random binary sequence generator.

PRBS generator 40 in FIG. 4 is better than PRBS generator 30 in FIG. 3 from a power perspective because PRBS generator 40 allows the clock frequency to be reduced by a factor of four while maintaining the same number of latches as in PRBS generator 30. After accounting for the additional power consumptions from XORs 41–43, the total power consumption of PRBS generator 40 is reduced by nearly a factor of four over the total power consumption of PRBS generator 30.

Figure 5:
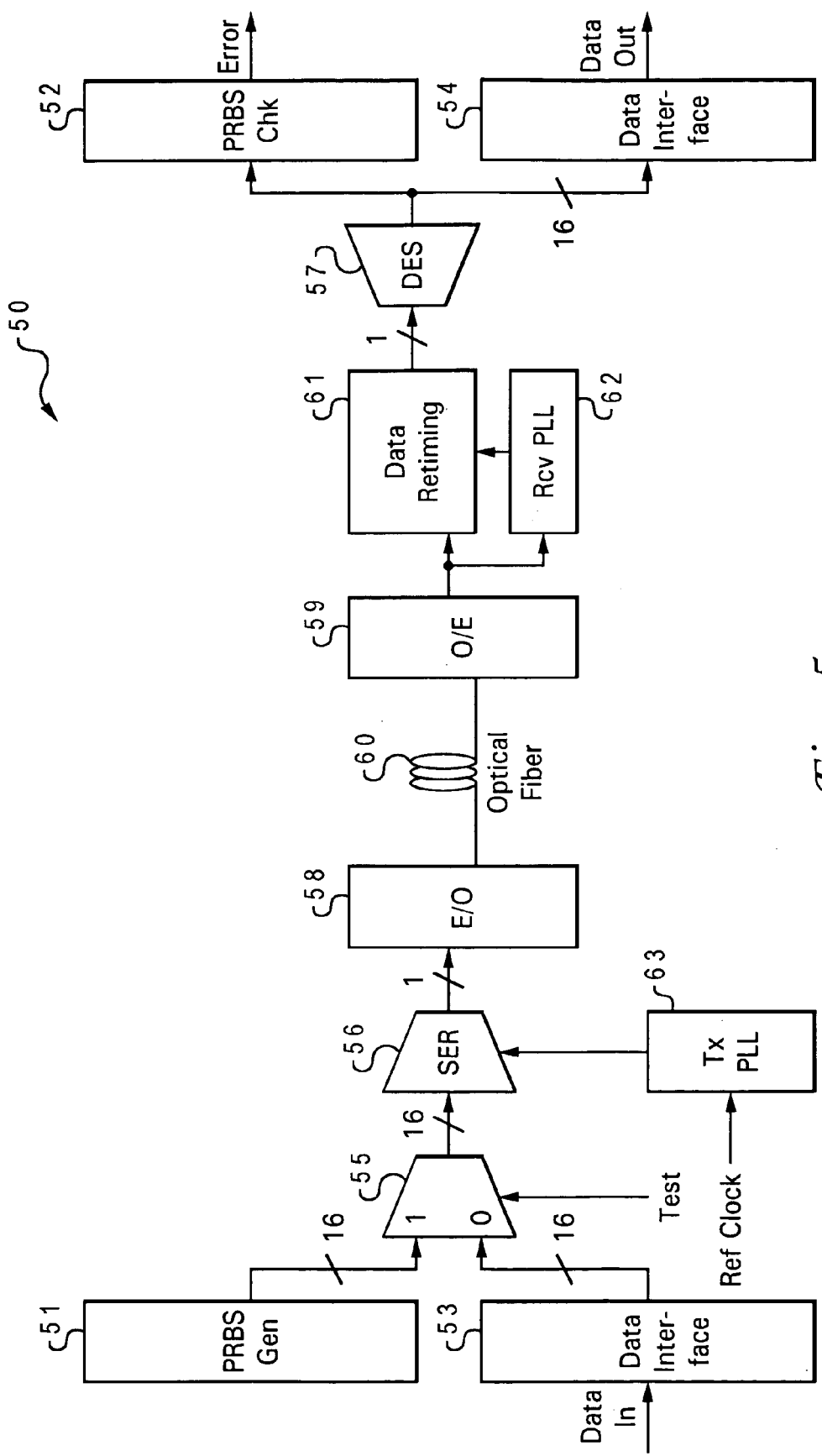
FIG. 5 is a block diagram of an optical interface in which a preferred embodiment of the present invention is incorporated.

Referring now to FIG. 5, there is illustrated a block diagram of an optical interface in which a preferred embodiment of the present invention is incorporated. As shown, an optical interface 50 includes a parallel PRBS generator 51 at the sending end, and a parallel PRBS checker 52 at the receiving end. At the sending end, optical interface 50 also includes a data interface 53 for receiving incoming data to be transmitted, and a selection multiplexor 55 for selecting the source of data to be transmitted. Also included is an N-to-1 serializer (commonly known as a multiplexor) 56 clocked by a transmit phase-locked loop (PLL) 63 at a frequency f determined by a reference clock and the internal PLL ratio. The single-bit serialized outputs from N-to-1 serializer 56 is converted to optical signals by an electrical-to-optical (E/O) converter 58, which is then transmitted onto an optical fiber 60. Generally, the length of optical fiber 60 can be very long and its accessibility is very limited (such as when being run across the bottom of the Pacific Ocean).

At the receiving end, the process is reversed beginning with an optical-to-electrical (O/E) converter 59, followed by a data retiming module 61 that is clocked by a receive PLL 62 having the capability to extract the optimal clock phase from the incoming data stream. The resulting retimed serial data is converted back to multiple N-bit parallel words by a deserializer 57 and then passed via an N-bit bus to a data interface 54 and PRBS checker 52.

By inspection of FIG. 5, it can be seen that when a test sequence is required to be sent across optical interface 50, the test sequence is preferably to be generated and checked in a parallel fashion. This is because N-to-1 serializer 56 is configured to accept incoming data in parallel and convert the incoming data to a serial stream required by E/O converter 58 and optical fiber 60. As an example, the value of N in FIG. 5 is 16 and the PRBS generation and checking can be performed by using the parallel PRBS generation scheme detailed above extended to 16 bits.

Just as PRBS generator 10 in FIG. 1 can be reconfigured slightly to function as a PRBS checker (shown in FIG. 2), parallel PRBS generator 40 in FIG. 4 can be reconfigured to function as a parallel PRBS checker. Same as PRBS generator 10 in FIG. 1, each of parallel PRBS generator 51 and parallel PRBS checker 52 in FIG. 5 preferably has a 31 latches for implementing the polynomial $1+x^{28}+x31$. Hence, the PRBS units described in the present disclosure are single-folded units. The concepts described herein are applicable to any polynomial and any folding scheme, but do only apply to folded (rather than serial) PRBS checking schemes.

One main problem in implementing a parallel PRBS checker (similar to parallel PRBS generator 40 from FIG. 4) is that the parallel PRBS checker has no knowledge of where in a testing sequence the parallel PRBS generator at the transmitting end commenced (which depends on how the latches within the parallel PRBS generator were initialized) and where in the testing sequence the checking operation is enabled (which is completely arbitrary). Further, since the data are serialized after they are generated by the parallel PRBS generator at the transmitting end, all framing information is lost and the parallel PRBS checker at the receiving end does not know where the frame boundaries are. Hence, some form of self-synchronization is required.

The self-synchronization begins by loading a parallel PRBS checker with two arbitrary samples of the bus coming out of the 1:16 deserializer and proceeds directly from that point. Within the core of the parallel PRBS checker, there is an LFSR identical to the one within the parallel PRBS generator. In the case of a 31-bit serial PRBS generator implementing the $1+x^{28}+x^{31}$ polynomial (i.e., PRBS generator 10 in FIG. 1), a set of parallel-rate update equations analogous to the contents of Table I can be developed, as follows:

TABLE II

| Feedback Equations | Feedback Equations | Output Equations |
|---|---|---|
| F15 = R30 + R27 | F30 = R14 | OUT15 = R30 |
| F14 = R29 + R26 | F29 = R13 | OUT14 = R29 |
| F13 = R28 + R25 | F28 = R12 | OUT13 = R28 |
| F12 = R27 + R24 | F27 = R11 | OUT12 = R27 |
| F11 = R26 + R23 | F26 = R10 | OUT11 = R26 |
| F10 = R25 + R22 | F25 = R9 | OUT10 = R25 |
| F9 = R24 + R21 | F24 = R8 | OUT9 = R24 |
| F8 = R23 + R20 | F23 = R7 | OUT8 = R23 |
| F7 = R22 + R19 | F22 = R6 | OUT7 = R22 |
| F6 = R21 + R18 | F21 = R5 | OUT6 = R21 |
| F5 = R20 + R17 | F20 = R4 | OUT5 = R20 |
| F4 = R19 + R16 | F19 = R3 | OUT4 = R19 |
| F3 = R18 + R15 | F18 = R2 | OUT3 = R18 |
| F2 = R17 + R14 | F17 = R1 | OUT2 = R17 |
| F1 = R16 + R13 | F16 = R0 | OUT1 = R16 |
| F0 = R15 + R12 | | OUT0 = R15 |

In Table II, the quantity Fn represents the input signal to a latch Rn; i.e., F0 is the input to latch R0, F1 is the input to latch R1, etc. Given the above-mentioned equations, a folded 31-bit parallel PRBS generator can be implemented with 31 latches and 16 XOR gates. Such structure can be used directly by the parallel PRBS generator at the transmitting side and forms the core of the parallel PRBS checker at the receiving side. In the latter context, one can envision simply loading all 31 latches with two sequential samples from the output of a 1:16 deserializer (the $32^{nd}$ bit is not needed for a 32-bit PRBS checker because the $32^{nd}$ bit can be calculated directly from the other 31 bits).

One could then simply allow the parallel PRBS generator to free-run from there. Its output would be two 16-bit samples behind the deserializer output, so additional latches would be required to match up the data words for comparison. This could be done, but in a 40 gigabit/s serial data rate system, even these latches would have to run at 2.5 GHz, which is undesirable.

Hence, the key to the present invention is the realization that a secondary set of update equations can be written to advance the state of the preloaded parallel PRBS generator by two states per (parallel-rate) clock, instead of only one. In other words, if the state of the parallel PRBS generator is behind the deserializer data by a known number of states (two in the present example) as a result of the initial preload, the alternate update equations can be switched in to allow the parallel PRBS generator to "catch up" by one state per clock cycle. Once the parallel PRBS generator has advanced enough to catch up with the deserializer output, the "normal" update equations can be switched back in and the parallel PRBS generator is allowed to proceed with the sequence from there. At such point, the parallel PRBS generator is synchronized with the deserializer output, and a direct comparison can be made to check for errors in the received sequence. This, of course, assumes that no bit errors occurred in the bits used to preload the parallel PRBS generator while in fact a bit error is as likely here as anywhere else.

First, the auxiliary set of update equations is shown in Table III.

TABLE III

| Feedback Equations | Feedback Equations | Output Equations |
|---|---|---|
| F31 = R30 + R27 | F14 = R13 + R10 | OUT 15 = R30 |
| F30 = R29 + R26 | F13 = R12 + R9 | OUT 14 = R29 |
| F29 = R28 + R25 | F12 = R11 + R8 | OUT 13 = R28 |
| F28 = R27 + R24 | F11 = R10 + R7 | OUT 12 = R27 |
| F27 = R26 + R23 | F10 = R9 + R6 | OUT 11 = R26 |
| F26 = R25 + R22 | F9 = R8 + R5 | OUT 10 = R25 |
| F25 = R24 + R21 | F8 = R7 + R | OUT 9 = R24 |
| F24 = R23 + R20 | F7 = R6 + R3 | OUT 8 = R23 |
| F23 = R22 + R19 | F6 = R5 + R2 | OUT 7 = R22 |
| F22 = R21 + R18 | F5 = R4 + R1 | OUT 6 = R21 |
| F21 = R20 + R17 | F4 = R3 + R0 | OUT 5 = R20 |
| F20 = R19 + R16 | F3 = R2 + R30 + R27 | OUT 4 = R19 |
| F19 = R18 + R15 | F2 = R1 + R29 + R26 | OUT 3 = R18 |
| F18 = R17 + R14 | F1 = R0 + R28 + R25 | OUT 2 = R17 |
| F17 = R16 + R13 | F0 = R30 + R24 | OUT 1 = R16 |
| F16 = R15 + R12 | | OUT 0 = R15 |
| F15 = R14 + R11 | | |

The equations in Table III are developed by simply extending the equivalent equations from Table I (for the 7-bit PRBS generator example) for an additional 16 clocks.

Figure 6:
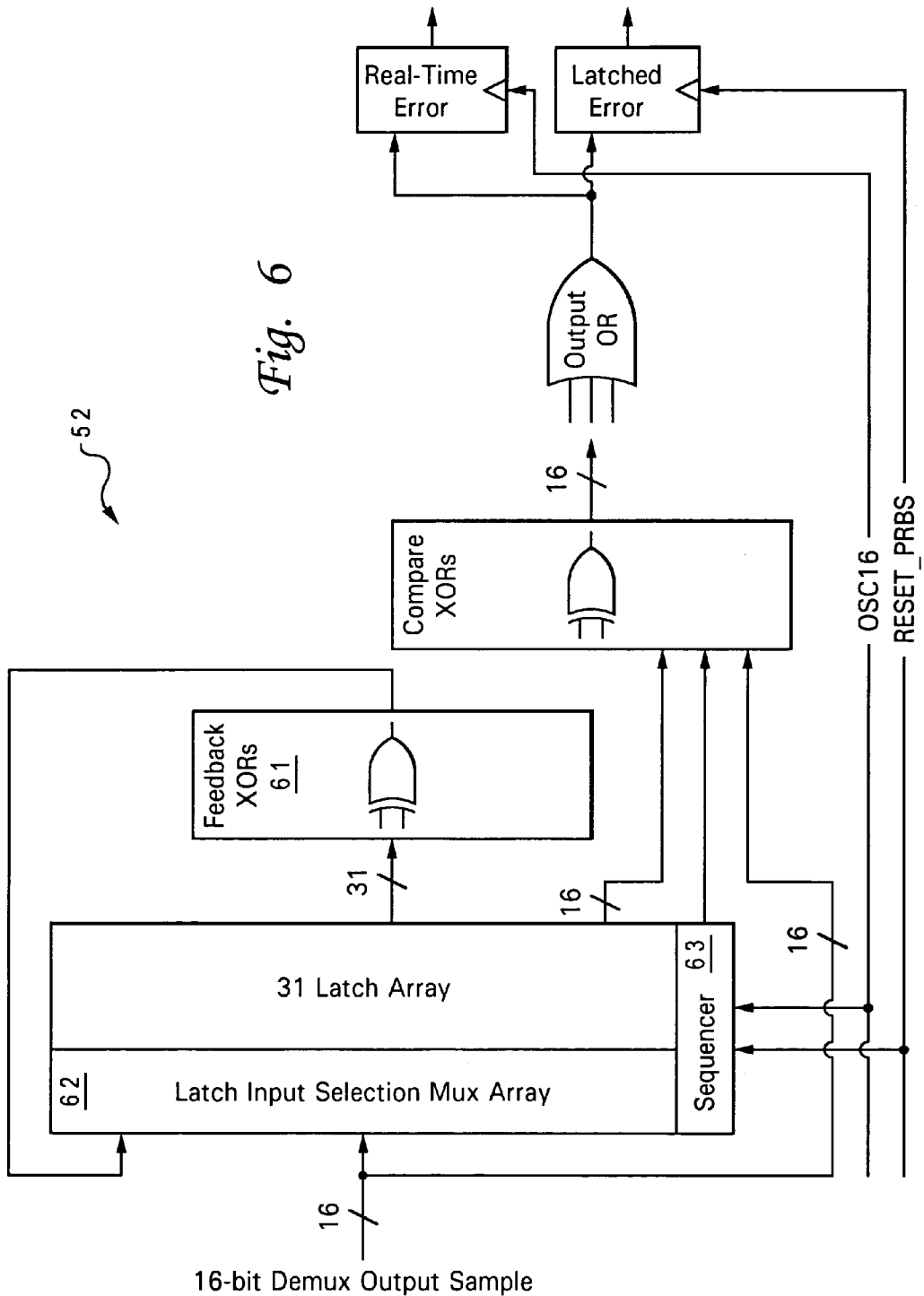
FIG. 6 is a block diagram of a parallel pseudo-random binary sequence checker, in accordance with a preferred embodiment of the present invention.

With reference now to FIG. 6, there is depicted a block diagram of parallel PRBS checker 52, in accordance with a preferred embodiment of the present invention. As shown, parallel PRBS checker 52 has 31 latches. These 31 latches are subdivided into a first group of 16, referred to as the most significant bit (MSB) latches and a second group of 15, referred to as the least significant bit (LSB) latches. PRBS checker 52 also includes 32 feedback XOR gates 61, also subdivided into two groups. The first group of 16 XOR gates implements the feedback equations described in Table II for the "normal" updates to parallel PRBS checker 52. The second group of 16 XOR gates implements the additional 16 feedback equations described in Table III for the "fast" updates to parallel PRBS checker 52. Each of the 31 latches in parallel PRBS checker 52 is preceded by a multiplexor 62, so that the input bit to each latch can be selected as follows:

0. A "normal advance" input connected to the output of XOR gates configured according to the equations in Table II;

1. A bit from the 16-bit sample bus coming from the deserializer;

2. A "fast advance input" connected to the output of the XOR gates configured according to the equations in Table III; and 3. The latch's own contents, essentially a "no update" mode.

A specific sequence of events is required in selecting which multiplexor input to direct into the latches during synchronization. This sequence is controlled by a state machine shown as sequencer block 63 in FIG. 6. In the present implementation, the state machine generates the sequence as shown in Table IV upon de-assertion of the RESET_PRBS signal.

TABLE IV

| Clock Cycle | Action |
|---|---|
| 0 | all latches read from deserializer output (default, reset state) |
| 1 | 16 MSB latches read hold state, 15 LSB latches load from deserializer output |
| 2 | all latches hold |
| 3 | all latches fast advance |
| 4 | all latches fast advance |
| 5 | all latches fast advance |
| 6 | all latches normal advance (hold state until reset) |

Sequencer 63 in FIG. 6 generates two select bits for the 16 MSB latches and two select bits for the 15 LSB latches, thereby allowing the multiplexors for each of the two groups of latches to select one of the four possible inputs as described above for each of the two groups of latches. The sequencer state machine itself requires three latches which operate at the parallel clock rate. But since these latches are only updated for the first 6 clock intervals following the start of synchronization they do not necessarily required much additional power dissipation. Note also that states 2 and 3 above could be omitted but were included here due to implementation concerns.

A more detailed description of how the invention operates follows. Consider once again parallel PRBS generator 51 in FIG. 5. This unit generates N-bit samples of the PRBS according to its specific algorithm, in this case N being 16 and the algorithm being $1+x^{28}+x^{31}$. These 16-bit samples are serialized, transmitted, received, and reconstructed by the components optical interface system 50 so that they appear at the output of deserializer 57. Assume for the moment that the boundaries between the samples are properly preserved through the serialization/deserialization process. This is not necessarily the case in a real system but neither is it necessarily required as will be discussed later. For the present discussion, however, this assumption will help clarify the operation. At any given parallel-rate clock cycle on the transmitting side, the 31 latches in PRBS generator 51 contain a state including the present 16-bit PRBS sample, hereinafter denoted $S_n$, in its 16 MSB latches and essentially the previous sample $S_{n-1}$ in its 15 LSB latches. Refer to cycle 4 in Table I for an example of how this applies to the simple 7-bit example. Returning to PRBS generator 51 in FIG. 5, sample $S_n$ is serialized and transmitted (at the serial clock rate) and then in the next parallel rate clock cycle PRBS generator 51 calculates sample $S_{n+1}$ using the normal update equations outlined in Table II. This process continues indefinitely with samples $S_{n+2}$, $S_{n+3}$, . . . and so on being calculated and transmitted.

At the receiving end, these samples appear at the output of deserializer 57. Under the assumption outlined above, one of these samples will be the one we denoted $S_{n-1}$ and the next one will be $S_n$. These appear on the deserializer output in successive cycles of the parallel clock. If the latches are forced in parallel PRBS checker 52, also having 31 latches, to contain first $S_{n-1}$ in the 15 LSB latches and then $S_n$ in the 16 MSB latches on these successive cycles of the parallel clock, the latches would be placed in PRBS checker 52 in the exact same state as was present in the latches of the generator when $S_n$ was created as outlined above. Now if the latches in the checker are updated in accordance with the normal update equations outlined in Table II, it will begin to produce samples $S_{n+2}$, Sn+3 . . . and so on. However, since it took two successive clock cycles to completely load the state of parallel PRBS checker 52, its sample is two clock cycles behind the sample on the deserializer output. As a result, a direct comparison between the calculated sample in parallel PRBS checker 52 and the output of deserializer 57 is impossible.

This can be remedied without the addition of more latches by forcing the sample in parallel PRBS checker 52 to update at a rate of two states per clock cycle rather than one. This effect is achieved by implementing the "fast advance" equations as shown in Table III for an appropriate number of clock cycles. Referring now to Table IV and assuming states 2 and 3 are in fact required by the implementation, at the end of state 2 the output of deserializer 57 will be three states ahead of the state of parallel PRBS checker 52 (two due to the initial state load and one due to the implementation-driven hold state 2). Consistent with the notation above, PRBS checker 52 contains state $S_{n-1}$ and deserializer 57 output represents state $S_{n+2}$. If the "fast advance" equations of Table III are implemented for the three subsequent clock cycles, PRBS checker 52 will "catch up" by one state per cycle. For example, at the end of state 3 in Table IV, output of deserializer 57 will represent state $S_{+3}$ and PRBS checker 52 will contain state $S_{n+1}$; because of the fast advance in PRBS checker 52 and normal advance in the transmitted sequence PRBS checker 52 has advanced by one additional state with respect to the output seen at deserializer 57. At the end of three such cycles, PRBS checker 52 will be synchronized with the output of deserializer 57. This permits direct comparison of the deserializer output and the calculated state of PRBS checker 52 for the following cycle and all subsequent cycles until such time as PRBS checker 52 is reset.

Revisiting now the assumption that the 16-bit samples are maintained in proper framing, examination of the PRBS itself shows that this is not necessary. For a sequence within the PRBS of length M>N (again in this case N being 16), any group of 16 consecutive bits is a valid 16-bit sample of the PRBS. In other words, if all consecutive groups of 16 bits in a suitably long PRBS sequence are examined, all possible combinations of 16 bits will occur precisely once. So it is not necessary to maintain the original 16-bit framing of parallel PRBS generator 51 in the transmitter.

PRBS errors are reported in two ways for the present invention. One output (the "real time" output) indicates that at least one of the 16 bits received in the current parallel clock cycle is in error. This signal is reset every parallel clock cycle. The second output (the "latched" output) is asserted when the first such error occurs and is held asserted until the next time the parallel PRBS checker is reset.

Figure 7:
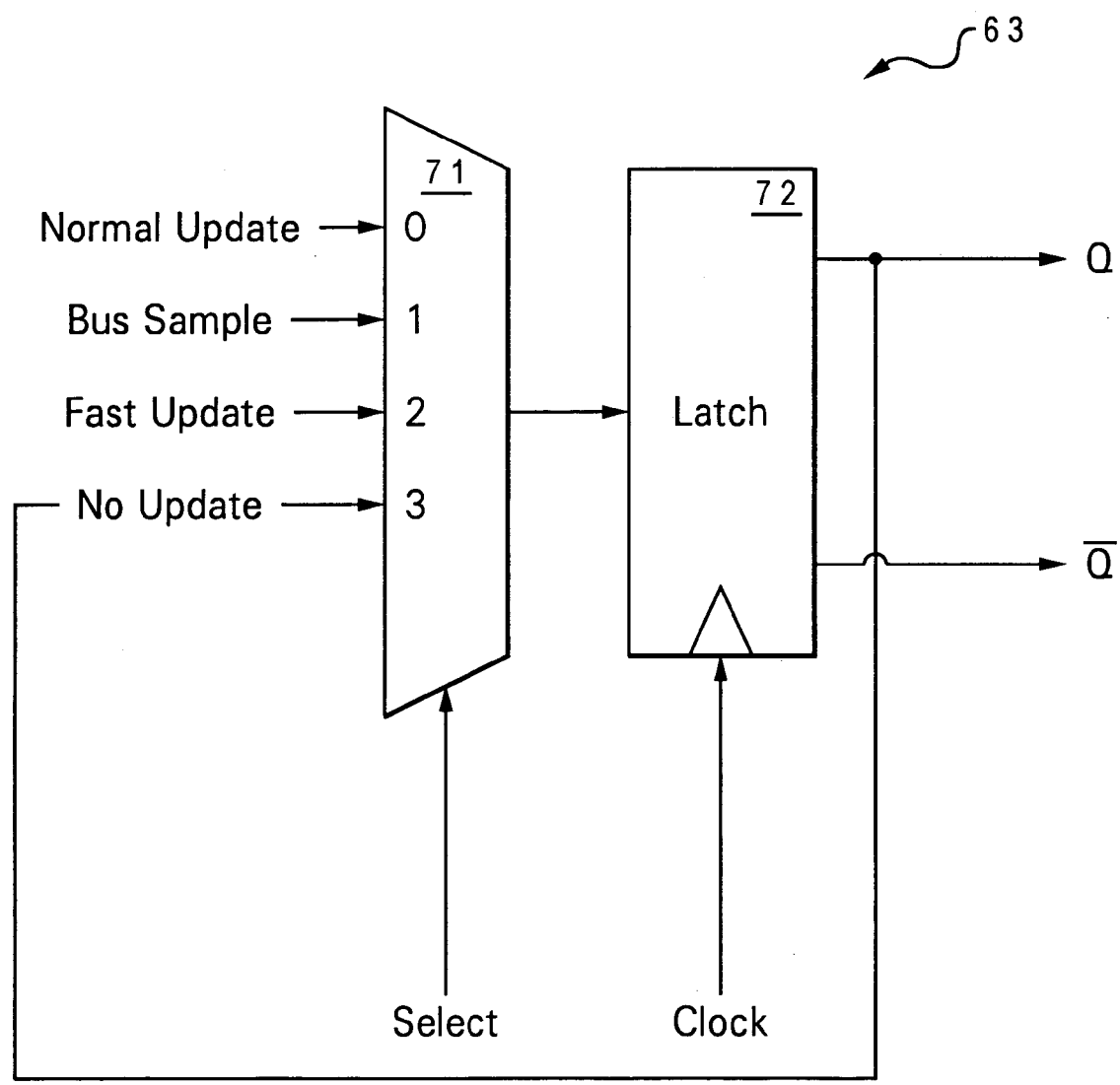
FIG. 7 is a block diagram of a latch circuit having a multiplexed input, in accordance with a preferred embodiment of the present invention.

Referring now to FIG. 7, each latch 72 in parallel PRBS checker 52 in FIG. 6 is preceded by a 4-to-1 multiplexor 71 so that the input to each latch can be selected as follows:

A "normal advance" input connected to the output of XOR gates configured according to the equations in Table II;

A bit from the 16-bit sample bus coming from the deserializer;

A "fast advance" input connected to the output of XOR gates configured according to the equations in Table III, and The latch's own contents; essentially a "no update" mode that allows the first 16 of the latches to be loaded to hold their state while another input sample is forced into the other 15 latches during synchronization.

Figure 8:
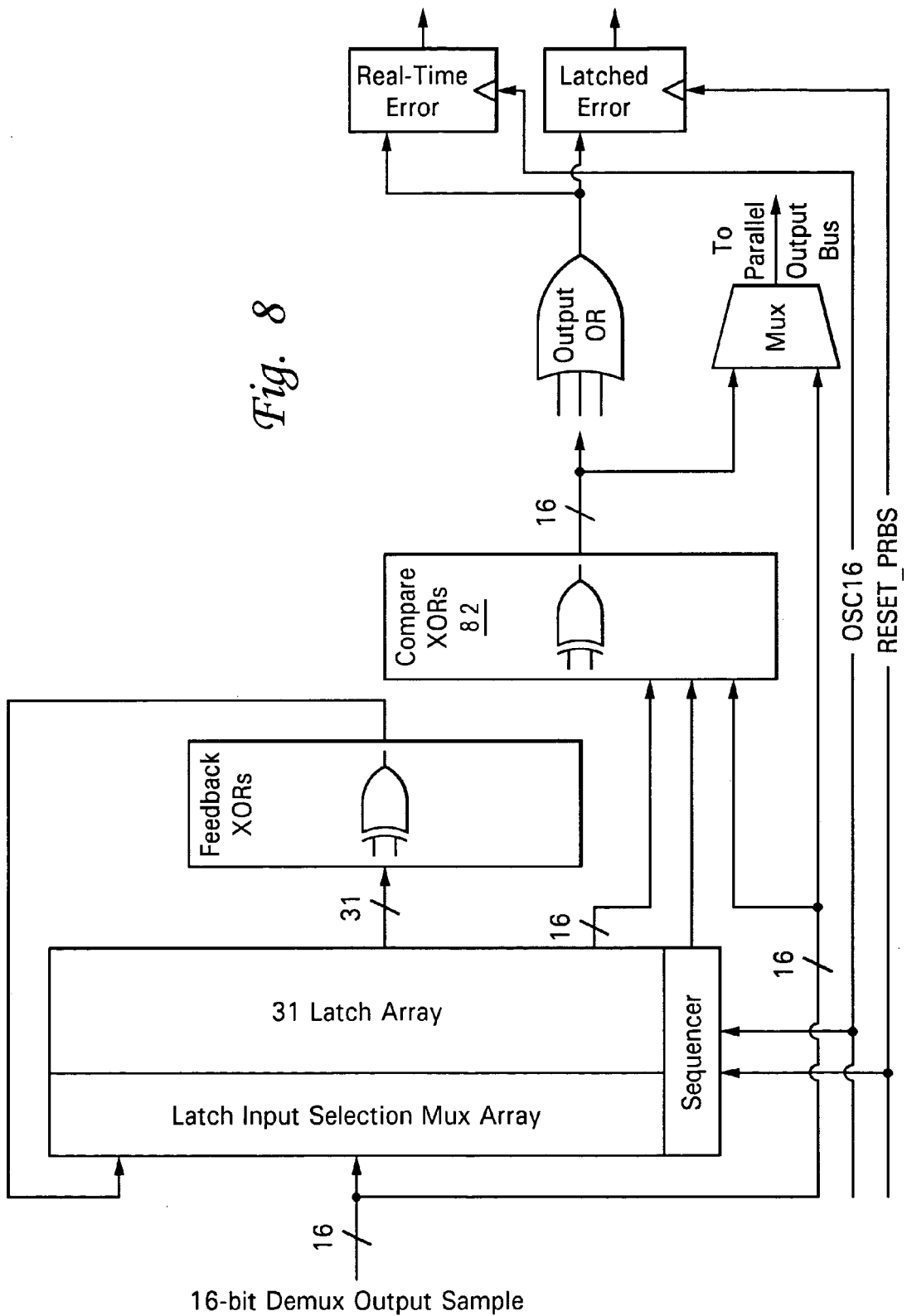
FIG. 8 is a block diagram of a parallel pseudo-random binary sequence checker, in accordance with a second embodiment of the present invention.

In FIG. 6, information concerning the specific bit in error in each group of 16 is lost in the output OR function. This need not be the case in the alternative embodiment as shown in FIG. 8. Specifically in the present embodiment, a multiplexor 83 is added to allow the bit error information calculated by compare XORs 82 to be passed directly to the output data interface, in place of the received data. Since the received data has no meaning (it is an artificially created PRBS after all), it may be of greater interest to observe which bit in each deserialized group of 16 is in error. For example, repeated errors on a specific bit may indicate problems in the deserializer retiming algorithm.

Figure 9:
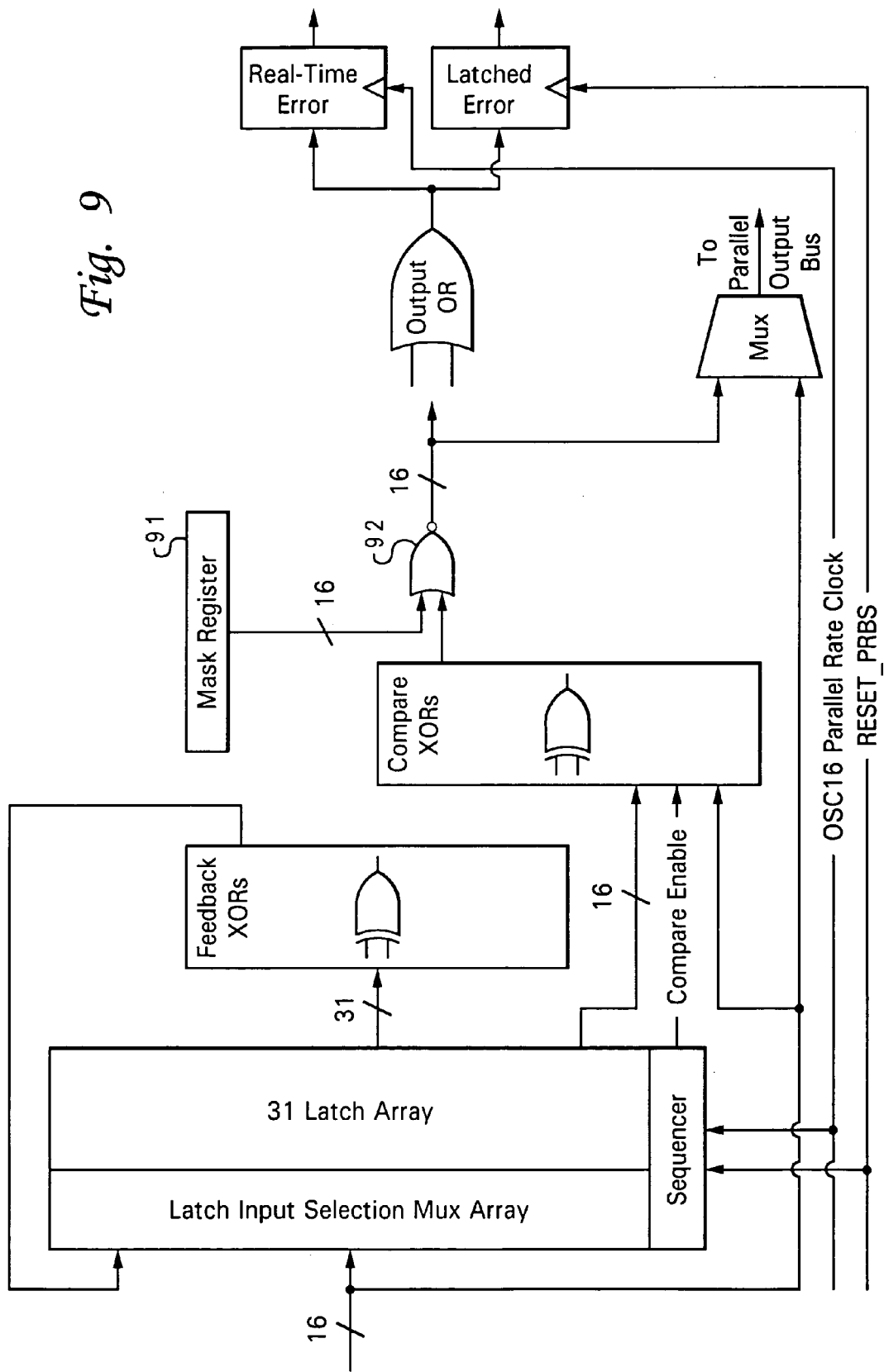
FIG. 9 is a block diagram of a parallel pseudo-random binary sequence checker, in accordance with a third embodiment of the present invention.

A third embodiment of the present invention is shown in FIG. 9. As shown, parallel PRBS checker 52 of FIG. 6 is augmented with the ability to mask specific bits in error in each group of 16. This is accomplished by inserting a group of 16 parallel NOR gates 92 between the output of the compare XORs and the final output OR. Each NOR gate has two inputs, one from one of the compare XORs and one from a mask register 91 whose contents can be set externally to parallel PRBS checker 52. Setting a bit position in mask register 91 to "1" forces the output of NOR 92 for that bit position to be "0" regardless of whether or not an error is detected by the compare XORs. This allows for characterization of the PRBS error rate even when one or more bits is chronically in error due to a design error or physical defect.

Figure 10:
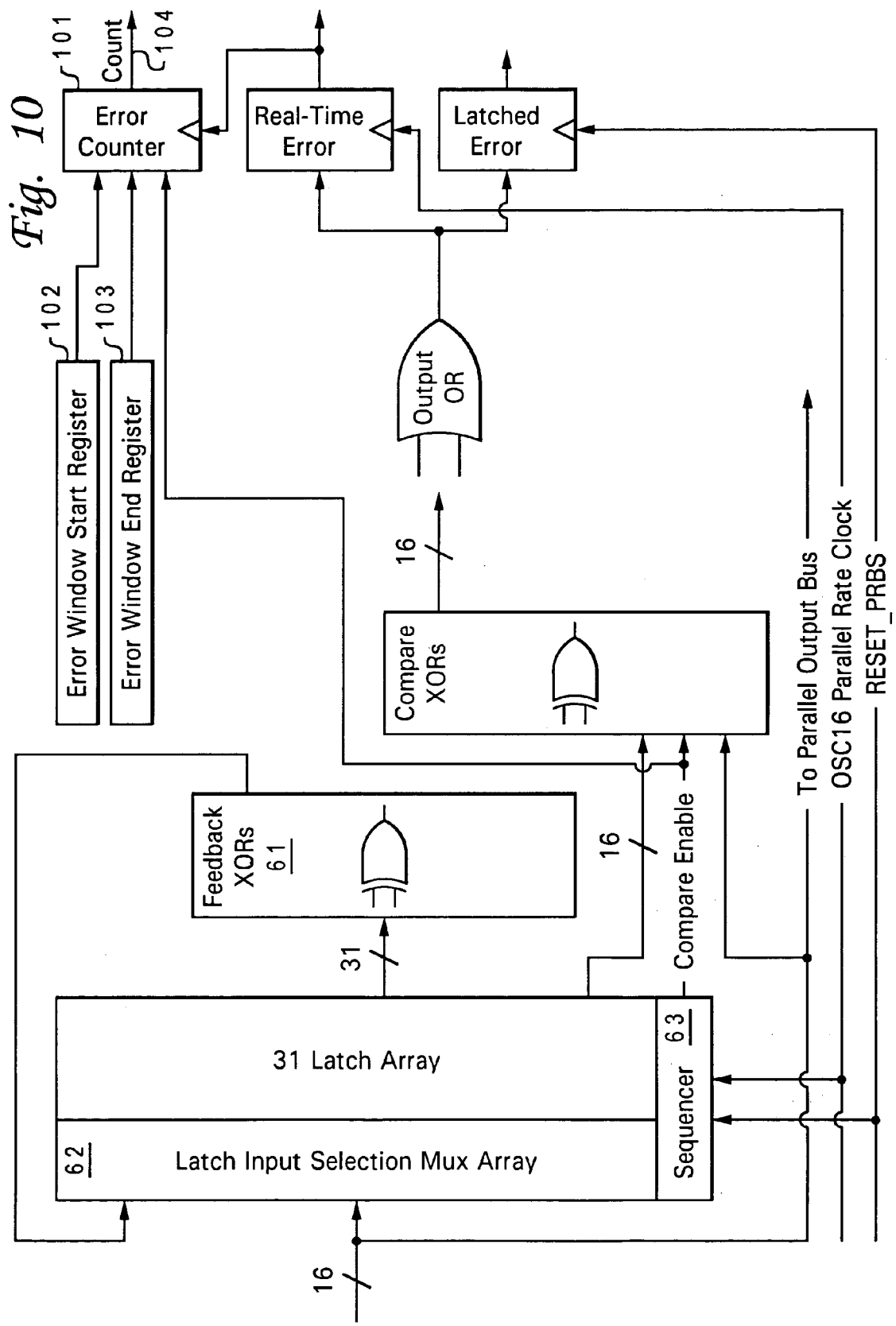
FIG. 10 is a block diagram of a parallel pseudo-random binary sequence checker, in accordance with a fourth embodiment of the present invention.

A fourth embodiment of the present invention is shown in FIG. 10. As shown, an error counter 101 has been added to parallel PRBS checker 52 of FIG. 6. Error counter 101 has an output 104 that represents the number of errors that have occurred since the last time parallel PRBS checker 52 was reset. Further, error counter 101 is enabled beginning at the time that parallel PRBS checker 52 has completed its automatic synchronization sequence and has enabled comparisons to begin by asserting its compare enable signal. Optionally, compare window registers 102 and 103 can be added to restrict the error count to a specific window of bytes following synchronization.

Figure 11:
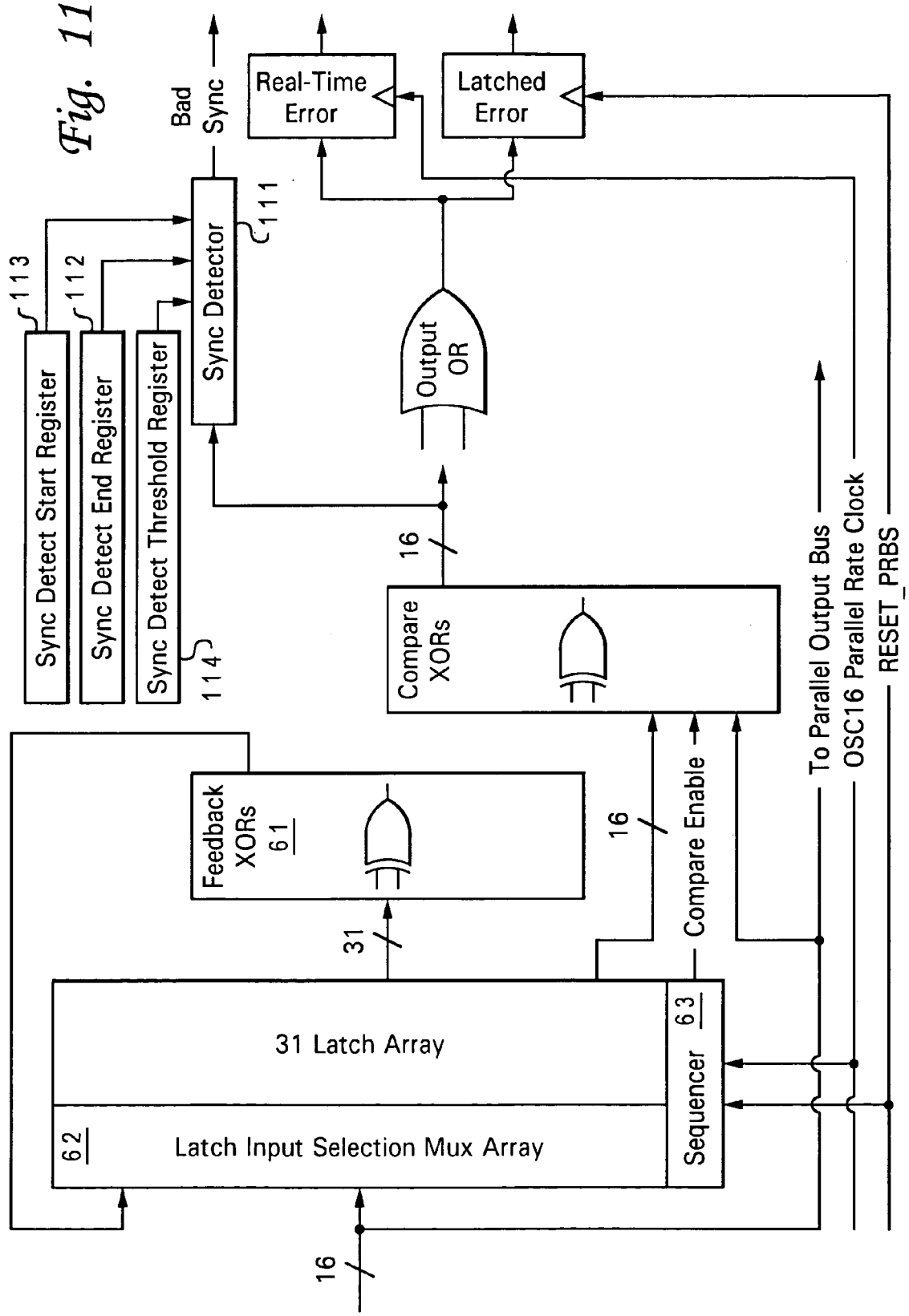
FIG. 11 is a block diagram of a parallel pseudo-random binary sequence checker, in accordance with a fifth embodiment of the present invention.

A fifth embodiment of the present invention is shown in FIG. 11. This embodiment allows the present invention to provide a logical indication of the occurrence of a failed synchronization. Consider that the overall purpose of the invention is to determine whether or not there are errors contained in a received PRBS. As explained previously, the present invention works by sampling two consecutive parallel samples from the output of a demultiplexor, loading these as an initial state, then using the known PRBS algorithm in a fast advance mode to synchronize its internal PRBS generator with the subsequent samples from the demultiplexor. However, since there is always a chance that a demultiplexor sample might contain a bit error, it is possible that the samples used to synchronize the parallel PRBS checker will contain an error. If this is the case, the parallel PRBS checker will fail to synchronize properly with the samples from the demultiplexor; instead, it will initialize to some other valid point in the sequence as described above. Since the sequence appears random, comparing the output of the improperly initialized PRBS checker with the samples from the demultiplexor will indicate bit errors in 50% of the bits, on average. If, on the other hand, the synchronization occurs correctly and the interface under test is working properly, the bit error rate would be expected to be quite low; perhaps 1 bit in every million bits or even lower. Hence, it should be possible to detect the improperly synchronized condition.

The apparatus in FIG. 11 helps detect such condition. To parallel PRBS checker 52 of FIG. 6 have been added a synchronization detector 111 and control registers 112, 113 and 114. The control registers can be accessed from outside the parallel PRBS checker and contain a start window location, a stop window location, and a threshold respectively. The start and stop window indicate a number of parallel clock cycles following completion of the synchronization sequence as in the previous embodiment. The threshold register can contain a number of bits to be detected in error to cause an error indication.

For example, suppose registers 112, 113 and 114 are set to 0, 8, and 4 respectively. Sync detector is a digital logic unit configured to provide a bad sync indication if four or more bits in error are found in the first eight parallel rate cycles following completion of synchronization.

As has been described, the present invention describes a parallel PRBS checker for testing data communication channels. The parallel PRBS checker of the present invention can indicate which bit in a received PRBS is in error when an error occurs. Also, the parallel PRBS checker of the present invention can indicate that an error has occurred in synchronizing the PRBS checker with the PRBS generator. Finally, the parallel PRBS checker of the present invention can estimate the bit error rate on a data communication channel over which the PRBS is transmitted.

While the invention has been particularly shown and described with reference to a preferred embodiment, it will be understood by those skilled in the art that various changes in form and detail may be made therein without departing from the spirit and scope of the invention.

The invention claimed is:

1. A parallel pseudo-random binary sequence checker comprising:
 a receiving means for receiving a pseudo-random binary sequence, wherein said pseudo-random binary sequence is generated by a pseudo-random binary sequence generator n bits at a time in parallel;
 means for automatically synchronizing the state of said receiving means with an n-bit sample within said pseudo-random binary sequence to generate a next n-bit sample within said pseudo-random binary sequence;
 means for comparing said next generated n-bit sample within said pseudo-random binary sequence to a corresponding next received n-bit sample within said pseudo-random binary sequence; and
 means for indicating an error condition has occurred if said next generated n-bit sample within said pseudo-random binary sequence does not equal to said corresponding next received n-bit sample within said pseudo-random binary sequence.

2. The checker of claim 1, wherein said checker further includes
 means for loading 16 most significant bits to said checker;
 means for loading 15 least significant bits to said checker; and
 means for serially advancing a plurality of latches within said checker twice.

3. The checker of claim 1, wherein said checker further includes a multiplexor within said pseudo-random binary sequence generator for yielding output bits in parallel.

4. The checker of claim 1, wherein said checker further includes a mask register for masking specific bits in error.

5. The checker of claim 1, wherein said checker further includes an error counter for counting a number of errors occurred since said checker was reset.

6. The checker of claim 1, wherein said checker further includes a sync detector to indicate an occurrence of a failed synchronization.

7. A method for synchronizing a parallel pseudo-random binary sequence checker, said method comprising:
   receiving a pseudo-random binary sequence by a receiving means, wherein said pseudo-random binary sequence is generated by a pseudo-random binary sequence generator n bits at a time in parallel;
   automatically synchronizing the state of said receiving means with an n-bit sample within said pseudo-random binary sequence to generate a next n-bit sample within said pseudo-random binary sequence;
   comparing said next generated n-bit sample within said pseudo-random binary sequence to a corresponding next received n-bit sample within said pseudo-random binary sequence; and
   indicating an error condition has occurred if said next generated n-bit sample within said pseudo-random binary sequence does not equal to said corresponding next received n-bit sample within said pseudo-random binary sequence.

8. The method of claim 7, wherein said method further includes
   loading 16 most significant bits to said parallel pseudo-random binary sequence checker;
   loading 15 least significant bits to said parallel pseudo-random binary sequence checker; and
   serially advancing a plurality of latches within said parallel pseudo-random binary sequence checker twice.

9. The method of claim 7, wherein said method further includes providing a multiplexor within said pseudo-random binary sequence generator for yielding output bits in parallel.

10. The method of claim 7, wherein said method further includes providing a mask register for masking specific bits in error.

11. The method of claim 7, wherein said method further includes providing an error counter to count a number of errors occurred since said parallel pseudo-random binary sequence checker was previously reset.

12. The method of claim 7, wherein said method further includes providing a logical indication of an occurrent of a failed synchronization.

* * * * *